INVENTORS
ALAN B. AMIDON
CARL BRYNKO
BY Ronald Zibelli
James J. Ralabate
ATTORNEYS

United States Patent Office 3,442,646
Patented May 6, 1969

3,442,646

FORMATION OF LIGHT SCATTERING IMAGES IN LAYERS COMPRISING ORGANIC PHOTOCHROMIC MATERIALS

Alan B. Amidon, Penfield, and Carl Brynko, West Webster, N.Y., assignors to Xerox Corporation, Rochester, N.Y., a corporation of New York Filed Oct. 1, 1965, Ser. No. 492,024
Int. Cl. G03c 5/04, 5/40
U.S. Cl. 96—27 11 Claims

ABSTRACT OF THE DISCLOSURE

Images are formed by exposing an imaging member comprising an organic photochromic material in an imaging layer to a pattern of actinic electromagnetic radiation to convert at least a portion of the material from one photochromic state to another to form a latent image and developing the imaging layer with a developing liquid which selectively wets the imaging layer in conformance with the latent image, the developing liquid containing sufficient solvent to dissolve at least a portion of the imaging layer underlying the wetted areas and a material which forms an incompatible solution with at least a portion of the dissolved portion of the imaging layer upon removal of the solvent.

This invention relates in general to a novel imaging system, and, more specifically, to a phase separation imaging system employing light induced changes in the wetting properties of organic photochromic compounds.

Materials which undergo reversible photo-induced color change are referred to as photochromic. In the absence of actinic radiation, these materials have a relatively stable configuration with a characteristic absorption spectrum. However, when a photochromic material is exposed to actinic radiation such as ultraviolet light, the absorption spectrum changes drastically so that the appearance of the material changes from colorless to red, red to green or the like. These property changes are believed to occur because of changes in the molecular or electronic configuration of the material from a lower to a higher energy state. These changes occur because the photochromic materials generally have very efficient routes for the internal conversion of absorbed excited state electronic energy into vibrational and torsional twisting modes of the molecule upon exposure to light. This conversion may, for example, result in the isomerization of the molecule. The conversion of each molecule normally takes place at an extremely rapid speed, but actual observation of a change in color in conventional systems takes longer because of the relatively low concentration produced per unit time and the depletion of the excited colored form by the competing but slower reconversion to the lower unexcited form. Accordingly, photochromic materials of lower conversion efficiency tend to produce pale color changes at best.

Unfortunately, the higher, colored form of the photochromic material exists in an excited, unstable condition which reverts to the lower form with its original absorption band and color after the source of actinic radiation is removed. Since imaging techniques proposed in the prior art employ the color change to make the image, these materials cannot be used in permanent imaging systems. Although an enormous amount of time, money and effort has been expended by many research organizations in attempting to stabilize the higher forms of a great many different photochromic compounds so as to make them suitable for use in practical imaging systems and, although some success has been achieved in slowing down the reconversion of the higher to the lower form of some photochromic compounds with various modifications of their substituents, no one has to date yet succeeded in permanently stabilizing these higher forms. Additional effort has been devoted to the problem of achieving maximum color change from the lower to the higher form of various photochromic compounds, but even had these goals been achieved, the problem of deactivating the lower form of photochromic material in background areas would still remain. In essence then, there have been two fixing problems in photochromic imaging involving both the stabilization of the higher colored form in exposed areas and the deactivation of the lower uncolored form in background areas of the image, and neither of these problems has been effectively solved. Consequently, the phenomenon of photochromism has remained largely a laboratory curiosity rather than an effective and commercially acceptable means of imaging.

It is accordingly an object of this invention to provide a novel imaging system.

It is a further object of the present invention to provide a novel imaging method based on the use of organic photochromic compounds.

Another object of this invention is to provide an imaging system which can effectively employ even these photochromic materials which exhibit little or no visible change in color on exposure.

A still further object of the invention is to provide an imaging method and apparatus utilizing photochromic compounds in which the image generated by the imagewise exposure of the compound serves only as a temporary latent image for the developing and fixing steps which produce the permanent image that in no way depends upon the permanency of the higher form of the photochromic compound itself.

Yet another object of this invention is to provide a novel imaging method and apparatus in which photochromic compounds are employed in a selective phase separation imaging system.

The above and still further objects of the present invention are accomplished, generally speaking, by providing a system in which a layer of a photochromic compound is exposed to an image with actinic electromagnetic radiation. This exposure source may constitute a source of visible light, ultraviolet light, X-ray or any other radiation source which is capable of converting the particular photochromic compound from one form to the other. Imagewise conversion of at least a portion of the photochromic layer from one state to the other forms a latent image because of the marked difference in contact angle which the two states of the photochromic compound will make with same liquid. In other words, one form will wet better than the other. It should be emphasized here that the exposure must only convert enough photochromic molecules to produce a significant difference between the contact angle of the exposed and unexposed areas. Because of the relatively small number of molecules which must be converted to fulfill this requirement with some materials, a visible color change need not necessarily be produced in all instances. The latent image on the photochromic layer is then developed by contacting the layer over its whole surface with a liquid which will form an incompatible solution at the surface of the photochromic layer. Since the liquid wets selectively according to the latent image pattern, the light scattering surface produced upon drying occurs in imagewise configuration.

The photochromic layer may be composed solely of one or more photochromic compounds providing that it has sufficient strength. For convenience, however, the photochromic material will generally be dissolved in solid solution or dispersed in a natural or synthetic resin. This resin may be thought of as a binder or matrix for the photochromic material. The use of such a resin as a binder or matrix for the photochromic compound permits the choice of the photochromic compound to be made from an even larger group of materials including even those which have relatively low strength, poor film forming ability and which will not form a good phase separation image alone. Since many photochromic compounds are relatively expensive, the use of the resin also serves to decrease the overall cost of the imaging layer. In carrying out the invention, a number of different imaging configurations and/or liquid developers may be employed. For example, the photochromic material dispersed in a first resin binder may be overcoated with a transparent second resin layer made up of a resin which is incompatible with the resin of the photochromic layer so that when this two layer imaging member is dipped in a liquid which is at least a partial solvent for the two resins, it swells and penetrates to their interface forming a saturated solution there. After penetrating the entire thickness of the upper transparent resin layer, the solvent penetrates into the underlying photochromic layer to also dissolve a portion of that layer. Owing to exposure of the photochromic layer, however, penetration into the underlying layer is limited to the more wettable photochromic layer which is either exposed or the unexposed area, depending upon the characteristics of the particular photochromic employed. As a result, a solution of two incompatible polymers is formed immediately above the more wettable areas of the photochromic layer. On drying, phase separation occurs producing a rough, light scattering surface at the interface of the two layers.

In another embodiment of the process, a single photochromic-binder layer is employed, without an incompatible resin overcoating layer and after exposure, this imaging member is merely treated with a predissolved solution of an incompatible polymer to produce the same effect as produced in the above embodiment except that the light scattering image is formed at the surface of the imaging member rather than at an interface within it.

In yet another embodiment of the invention, a single photochromatic-resin binder layer is treated with a liquid developer which contains both a solvent and a nonsolvent for the layer and in which the non-solvent evaporates more slowly than the solvent. This liquid developer selectively wets the imaging layer according to the exposure pattern and as evaporation takes place, the concentration of nonsolvent in the liquid increases to the point where the solution formed by the treatment with the liquid becomes milky, causing the polymer to phase separate. Upon drying, this technique also produces a rough, light scattering surface pattern conforming to the exposure pattern.

In order that the invention will be more clearly understood, reference is now made to the accompanying drawings in which an embodiment of the invention is illustrated by way of example in which.

Figure 1:
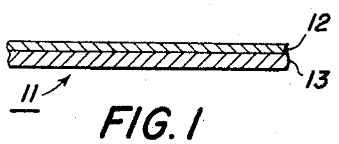
FIGURE 1 is a side sectional view of one imaging member made according to the invention.

Referring now to FIGURE 1, there is seen an exemplary imaging member generally designated 11 made up of an optically transparent resin 12 on a photochromic layer 13. In this embodiment of the invention the two layers 12 and 13 are selected for their incompatibility with each other. Imaging layer 13 may, as stated above, consist entirely of a photochromic compound providing that it is strong enough to have structural integrity when coated.

Since most photochromic compounds are relatively expensive as compared with resins which are suitable for use in combination therewith and since some photochromics have low physical strength, the photochromic will generally be dissolved in or dispersed in a resin. Any suitable resin may be used. Typical resins include Staybelite Ester 10 and Pentalyn H, glycerol esters and pentaerythritol, respectively, of partially (50%) hydrogenated rosin sold by the Hercules Powder Company of Wilmington, Del.; Velsicol EL–11, a terpolymer of styrene, indene and isoprene, marketed by the Velsicol Chemical Company of Chicago, Ill.; polyalpha-methyl styrene; Piccolyte S–70 and S–100 (polyterpene resins made predominantly from beta pinene available from the Pennsylvania Industrial Chemical Company and having ring and ball melting points of 70° C. and 100° C., respectively); Piccopale 70SF and 85 (nonreactive olefindiene resins, available from the Pennsylvania Industrial Chemical Company having melting points of 70° C. and 85° C. and molecular weights of 800 and 100, respectively); Piccodiene 2212 (a styrene-butadiene resin available from the same company); Piccolastic A–75, D–100 and E–100 (polystyrene resins with melting points of 75° C., 100° C. and 100° C. available from the same company); Neville R–21, R–9 and Nevillac Hard (coumarone-indene resins); Amberol ST137X (an unreactive, unmodified phenolformaldehyde resin available from Rohm & Haas); ethyl cellulose; ethyl hydroxy cellulose; nitrocellulose; ethyl acrylate polymer, methyl acrylate polymer; methyl methacrylate polymer; Carboset XH–1 (an acrylic acid polymer available from B. F. Goodrich Company) Pliolite AC (a styrene-acrylate copolymer); Pliolite VTAC (a vinyl toluene-acrylate copolymer); and Neolyn 23 (an alkyd resin available from Hercules Powder Company) chlorinated rubber; paraffin wax; polycarbonates; polyurethanes; epoxies; polyvinyl chloride; polyvinylidene chloride; polyvinyl butyral; shellac; amineformaldehydes; polyvinyl acetals; silicones; phenoxies; polyvinyl fluorides and mixtures and copolymers thereof.

As stated above when a two layer imaging member is employed, the upper layer 12 may consist of any suitable optically transparent material which will form an incompatible solution with the photochromic layer. Thus, for example, this material may consist of any suitable one of the resins in the list immediately above so long as the selected resin forms an incompatible solution with the resin selected for use in the photochromic layer. It is also preferable to keep layer 12 fairly thin, on the order from about .1 to about 2 microns thick so as to enable the speedy penetration of the solvent through this layer and also to prevent this transparent layer from masking the photochromic layer from the imaging light source.

As stated above, the percentage of photochromic compound in the imaging layer 13 may range anywhere from 100% by weight of photochromic compound down to about 1% by weight of photochromic with the remainder being a resin of the type described herein. Any suitable photochromic compound may be employed. Typical photochromic compounds include:

Spiropyrans such as 1,3,3-trimethyl-6′-nitro-8′-allyl-spiro (2″H-1′-benzopyran-2,2′-indoline);
1,3,3-trimethyl-5,6-dinitro-spiro (2′H-1′-benzopyran 2,2′-indoline);
1,3,3-trimethyl-8′-nitro-spiro (2′H-1′-benzopyran-2,2′-indoline);
3-methyl-6-nitro-spiro-[2H-1-benzopyran-2,2′-(2′H-1′-beta-naphthopyran)];
1,3,3-trimethyl-8′-nitro-spiro (2′H-1′-benzopyan-2,2′-indoline);
1,3,3-trimethyl-6′-methoxy-8′-nitro-spiro (2′H-1′-benzopyran-2,2′-indoline);
1,3,3-trimethyl-7-methoxy-7′-chloro-spiro (2′H-1′-benzopyran-2,2′-indoline);
1,3,3-trimethyl-5-chloro-5′-nitro-8′-methoxy-spiro (2′H-1′-benzopyran-2,2′-indoline);

1,3-dimethyl-3-isopropyl-6′-nitro-spiro (2′H-1′-benzopyran-2,2′-indoline);
1-phenyl-3,3-dimethyl-6′-nitro-8′-methoxy-spiro (2′H-1′-benzopyran-2,2′-indoline);
7′-nitro-spiro-[xantho-10,2′ (2′H-1′-benzobetanaphthopyran)];
3,3′-dimethyl-6′-nitro-spiro (2′H-1′-benzopyran-2,2′-benzothiazole);
3,3′-dimethyl-6′-nitro-spiro (2′H-1′-benzopyran-2,2′-benzo-oxazole);
1,3,-trimethyl-6-nitro-spiro (2′H-1′-benzopyran-2,2′-indoline);
6′-nitro-8′-methoxy-1,3,3-trimethyl-indolinebenzopyrylospiran;
6′-nitro-1,3,3-trimethyl-indolinobenzopyrylospiran;
8′-allyl-1,3,3-trimethylindolinobenzopyrylospiran;
8′-carbomethoxy-1,3,3-trimethylindolinobenzopyrylospiran;
8′-methoxy-1,3,3-trimethylindolinobenzopyrylospiran;
6′,8′-nitro-1,3,3,3-trimethylindolinobenzopyrylospiran;
7′-nitro-1,3,3-trimethylindolinobenzopyrylospiran;
8′-nitro-1,3,3-trimethylindolinobenzopyrylospiran;
6′,8′-dibromo-1,3,3-trimethylindolinobenzopyrylospiran;
6′-chloro-8′-nitro-1,3,3-trimethylindolinobenzopyrylospiran;
5-nitro-6′-nitro-1,3,3-trimethylindolinobenzopyrylospiran;
6′-nitro-8′-fluoro-1,3,3-trimethylindolinobenzopyrylospiran;
6′-methoxy-8′-nitro-1,3,3-trimethylindolinobenzoypyrylospiran;
5′-nitro-8′-methoxy-1,3,3-trimethylindolinobenzopyrylospiran;
6′-bromo-8′-nitro-1,3,3-trimethylindolinobenzopyrylospiran.

Anthrones such as 4,4′-methylanthrone;
4,4′-methoxybianthrone;
3-chloro-10-(9′-xanthylidene)-anthrone;
3-methyl-10-(9′-xanthylidene-anthrone;
4′-chloro-10-(9′-xanthylidene)-anthrone; and
10′-9′-2′-methyl xanthylidene)-anthrone.

Sydnones such as

N-(3-pyridyl)-sydnone;
N-benzylsydnone;
N-p-methylbenzyl-sydnone;
N-3,4-dimethyl-benzylsydnone;
N-p-chlorobenzylsydnone N,N′-ethylene-bissydnone; and
N,N′-tetramethylenebissydnone.

Anils such as salicylidene aniline;
5-bromo salicylidene-alpha-naphthylamine;
salicylidene-m-phenylenediamine;
salicylidene-m-toluidene;
salicylidene 3,4-xylidene;
salicylidene-p-anisidene;
o-nitrobenzidene-p-aminobiphenyl;
o-nitrobenzidene-m-nitroaniline;
o-nitrobenzidene-p-phenetidine;
salicylidene-p-aminobenzoic acid;
p-hydroxy benzidene-p-bromo-aniline;
p-hydroxy-benzidene 2,4-xylidine-2-hydroxy-3-methoxy-benzidene 2,5-xylidine; and
salicylidene-o-chloroaniline.

Hydrazones such as the 2,4-dinitro-phenylhydrazone of 5-nitro-salicylaldehyde;
benzaldehyde beta-naphthyl-hydrazone;
benzaldehyde anisylhydrazone;
benzaldehyde-m-chloro-phenylhydrazone;
benzaldehyde-p-bromophenylhydrazone;
cinnamaldehyde phenylhydrazone;

cinnamaldehyde beta-naphthylhydrazone;
cinnamaldehyde-m-tolylhydrazone;
cinnamaldehyde-p-tolylhydrazone;
cinnamaldehyde 3,4-xylyhydrazone;
p-dimethylamino benzaldehyde beta-naphthylhydrazone;
2-furaldehyde beta-naphthylhydrazone;
1-phenol-1-hexen-3-one-phenylhydrazone;
piperonal anisylhydrazone;
piperonal-m-chlorophenylhydrazone;
piperonal beta-naphthylhydrazone;
piperonal-m-tolylhydrazone;
p-tolualdehyde phenylhydrazone;
vanillin betanaphthylhydrazone.

Osazones such as benzil beta-naphthyl-osazone;
benzil m-tolylosazone;
benzil 2,4-xylylosazone;
4,4′-dimethoxy benzil beta-naphthylosazone;
4,4′-dimethoxy benzil phenylosazone;
4,4′-dimethoxy benzil-2,4-xylylosazone;
3,4,3′4′-bis (methylenedioxy) benzil alpha-naphthylosazone;
3,4,3′4′-bis (methylenedioxy) benzil 2,4-xylylosazone.

Semicarbazones such as chalcone semicarbazone;
chalcone phenyl semicarbazone;
2-nitrochalcone semicarbazone;
3-nitrochalcone semicarbazone;
cinnamaldehyde semicarbazone;
cinnamaldehyde thiosemicarbazone;
o-methoxy cinnamaldehyde semicarbazone;
o-methoxy cinnamaldehyde thiosemicarbazone;
o-methoxy cinnamaldehyde phenylsemicarbazone;
1-(4-methoxyphenyl)-5-methyl-1-hexen-3-one-semicarbazone;
1-(1-naphthyl)-1-hexen-3-one-semicarbazone;
1-phenyl-1-penten-3-one-semicarbazone.

Stilbene derivatives such as 4,4′-diformamido-2,2′-stilbene disulfonic acid;
4,4′-diacetamido-2,2′-stilbene disulfonic acid and its sodium, potassium barium strontium, calcium, magnesium and lead salts;
4,4′-bis (4-acetamidobenzoyleneamido)-2,2′-stilbene disulfonic acid;
4,4′-bis (p-(p-acetamido-benzamido) benzamido)-2,2′-stilbene disulfonic acid.

Fulgides (substituted succinic anhydrides) such as alpha anisyl-gamma-phenyl fulgide;
alpha, gamma-dianisyl fulgide;
alpha, gamma-dicumyliso fulgide;
alpha, gamma-diphenyl fulgide;
alpha, gamma-distyryl fulgide;
alpha-piperonyl-gamma-phenyl fulgide;
tetraphenyl fulgide.

Amino-camphor compounds such as 3-(p-dimethyl aminophenylamino)-camphor and
3-(p-diethylaminophenylamino)-camphor.

Thio indigo dyes: o-nitrobenzyl derivatives such as 2-(2′,4′-dinitrobenzyl pyridine;
2,4,2′-trinitrodiphenylmethane;
2,4,2′,4′,2″,4″-hexanitro-triphenylmethane;
ethyl bis (2,4-dinitrophenyl) acetate;
2-(2′-nitro-4′-carboxybenzyl pyridine);
3,3′-dinitro-4,4′-bis (2-pyridylmethyl)-azoxybenzene; and
4-(2′-nitro-4′-cyanobenzyl pyridine.

The spiropyrans are, however, a preferred class of materials owing to their superior and more sensitive imaging capabilities. Whether photoresponsive layer 13 consists of a pure photochromic compound or a blend of a photochromic compound with a resin as described above, it may be coated by any convenient technique such as dip coating, extrusion, whirl coating, casting or the like using either a hot melt or a solution of the materials to be coated.

Figure 2:
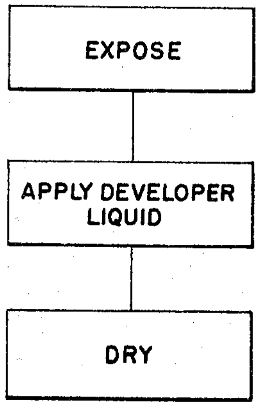
FIGURE 2 is a flow diagram of the process steps of the invention.

As shown in FIGURE 2 the basic steps involved in carrying out the process of this invention involve exposing the photoresponsive imaging member 11 to an imagewise pattern of actinic electromagnetic radiation, treating the exposed layer with a solvent and drying the phase separation pattern formed to make it visible and permanent. In exposing to the image to be reproduced any source of electromagnetic radiation which is actinic to the photochromic material may be employed. In the case of most photochromic compounds in their lower or unexcited forms an ultraviolet radiation source may be conveniently employed to expose the material in imagewise configuration so as to convert exposed areas to the higher or excited form of the material, although light of this short wavelength is not always required. Since many photochromic materials in their higher or excited forms may be "triggered" or caused to revert to the lower, unexcited form by exposure to visible light, a light source in the visible range (from about 4000–7500 angstrom units) may be conveniently employed for image-wise exposure of a photochromic film which had initially been uniformly converted to the higher or excited form. This type of exposure will then convert exposed areas to the unexcited or lower form of the photochromic material while the background or unexposed areas remain in the excited form. Providing that the image is developed before the background areas of the photochromic material revert to the lower unexcited form this technique may be conveniently employed for positive to negative imaging. The intensity of the exposure need not necessarily be strong enough to produce an intense color change in the photochromic compound since with most materials this requires a conversion of a gross amount of the photochromic from one form to the other, while to be operative in the process of this invention only enough photochromic material must be converted so that a differentially wettable pattern can be formed on the imaging layer 13. The term "photochromic" should be understood in this context as it is used throughout the specification and claims.

Once exposure is complete the imaging member is exposed to the developing liquid. In the event that the two layer imaging member described above is employed this developing liquid merely consists of a solvent for layers 12 and 13. Any suitable solvent may be employed and in the event that the photochromic layer is made up of a photochromic material included in a binder the solvent need not necessarily dissolve the photochromic material as well as the binder as long as it will dissolve one of these components which will form an incompatible solution with the transparent resin overcoating layer. Where a single layer imaging member is employed the developing liquid may simply consist of the same type of solvent in which there is dissolved a resin or other material which is incompatible in solution with the dissolved photochromic layer. The only difference between these two systems is that in the first two layer approach one of the incompatible resins is included as a layer of the imaging member whereas in the other embodiment the resin is dissolved in the developing solution. In a third embodiment of the invention the single layer of photochromic imaging member is treated with a blend of a solvent and a nonsolvent therefore with the solvent being more volatile than the nonsolvent so that the concentration of the nonsolvent increases as evaporation of the developing liquid proceeds. When this concentration becomes high enough phase separation occurs producing a roughened surface when drying is completed in the wetted areas. As with the other two embodiments of the invention the areas of the photochromic layer which are wet by the developing liquid corresponds to the image pattern to which the photochromic layer is exposed and wetting by this developing liquid occurs only in exposed or only in unexposed areas depending upon the particular photochromic compound which is employed.

Figure 3:
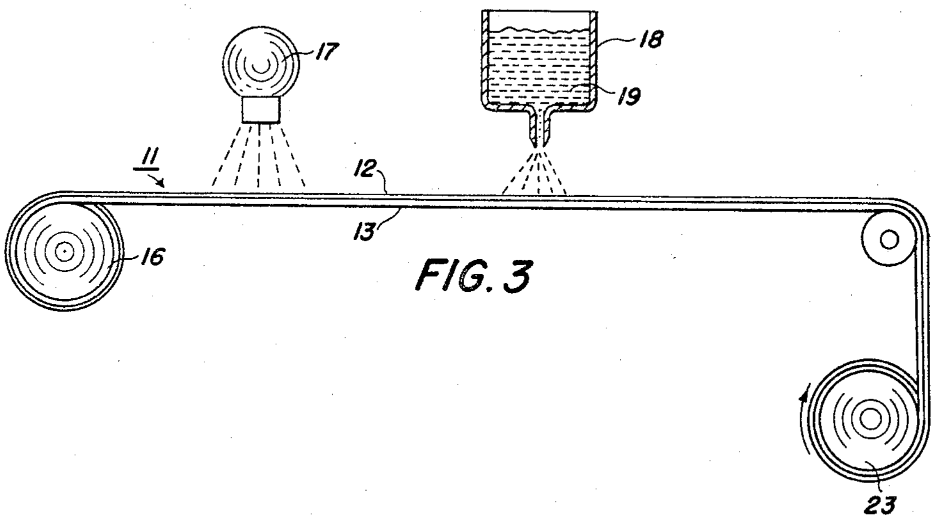
FIGURE 3 is a side sectional view of an illustrative embodiment of an apparatus adapted for imaging according to the invention.

In FIGURE 3, there is illustrated a simple exemplary apparatus for carrying out the imaging technique of the invention. In this apparatus imaging web 11 consisting of photochromic imaging layer 13 and transparent overcoating 12 comes off a supply roll 16 and passes under a projector 17 which projects a pattern of light and shadow corresponding to the image to be reproduced with an actinic light source on the photochromic layer of the imaging web 11 through the overcoating so as to convert the photochromic material included therein from one photochromic state to another in imagewise configuration. Following exposure, imaging web 11 passes beneath a spray applicator 18 which deposits solvent uniformly over its surface. This solvent swells and penetrates the transparent resin overcoating 12, dissolving a portion of it as well as a portion of the photochromic layer 13 in those areas where the photochromic is wetted by the penetrating liquid. A solution of two incompatible materials is thus formed at the interface adjacent the wetted areas. As the solvent evaporates off phase separation takes place forming a light scattering image in these wetted areas. The developed image on imaging web 11 is then rewound on takeup roll 23 after the solvent dries off. This same apparatus may be used in carrying out the other embodiments of the invention except that the developing liquid is changed to either a resin solution or a mixture of a solvent and a nonsolvent for the photochromic layer as described supra. The following illustrative examples of preferred embodiments of the invention are now given to enable those skilled in the art to more clearly understand and practice the invention described above. Unless otherwise indicated, all parts and percentages are taken by weight.

Example I

Four grams of 6′-nitro-1,3,3-trimethylindolinobenzopyrylospiran and 8 grams of Amberol ST–137X resin (described above) are dissolved in 88 grams of toluene. This solution is dip coated in the dark to a thickness of about 2 microns on an aluminum plate and air dried. This dried coating is then dipped in a 5% solution of Carboset (an alkali soluble acrylic acid resin available from B. F. Goodrich) in ammonia water and dried. The dried layers are then exposed to an image transparency with a 9-watt fluorescent light available from the Eastern Corporation of Westbury, N.Y., under the tradename Blacklite using a filter which passes about a 10 angstrom bandwidth centered on 3660 angstroms. After imagewise exposure a maroon colored image is seen to form on the film which is then treated with a methanol wash. The methanol penetrates and swells the entire Carboset layer and at the same time dissolves sufficient Carboset resin to form a saturated solution. This Carboset-methanol solution after penetrating the entire thickness of the Carboset layer penetrates into the Amberol layer, but only in the exposed areas. This sets up a polymer incompatibility in this region of the layer. On drying the exposed areas become light scattering giving a negative scattering image.

Examples II and III

The procedure of Example I is repeated with the exception that in Example II 4 grams of the resin and ½ gram of the 6′-nitro-1,3,3-trimethylindolinobenzopyrylospiran are used in the coating solution while in Example III the ratio is 1 gram of resin to 2 grams of the same photochromic spiran compound. Each of these produces about equal results with those produced by Example I.

Examples IV–XV

The procedure of Example I is followed exactly with the exception that the following resins are substituted for the Amberol resin of Example I in Examples IV–XV, respectively; Piccolyte S–70, Piccolyte S–100, Piccopale 70SF, Picopale 85, Piccodiene 2212, alphamethylstyrene polymer, Staybelite Ester 10, Piccolastic D–100, Piccolastic E–100, Neville R–9, Neville R–21, and Nevillac Hard. All produce about the same results as Example I.

Examples XVI–XIX

In Examples XVI and XVII, the procedure of Example I is repeated except that the photochromic compound employed is 3-N-pyridyl sydnone in Example XVI and phenyl sydnone in Example XVII.

In Examples XVIII and XIX, the following photochromic compounds are employed: In Example XVIII, the 2,4-dinitrophenylhydrazone of 5-nitro-salicylaldehyde is employed; and, in Example XIX, 3-N-pyridyl salicyidene is employed. In these two examples the procedure of Example I is followed except that the same filter is employed with a 100 watt light source for a 20 minute exposure. In all instances, the images formed are about equal in quality with the one produced by the procedure of Example I.

Example XX

The procedure of Example I is repeated exactly except that the coated film is first uniformly exposed to the 3660 angstrom light source until it achieves a deep maroon color. Following this exposure a transparency to be reproduced is overlaid on the imaging layer and exposed to a source of yellow light for one hour which serves to bleach or reconvert the excited colored form of the photochromic compound back to its unexcited, colorless form in exposed areas. The liquid development step of Example I is then carried out resulting in a photographic reversal of the original transparency.

Examples XXI–XXVII

The procedures of Example I is followed with the exception that the following photochromic compounds are used respectively, in Examples XXI–XXVII in place of the spiropyran photochromic compound of Example I: 2,4-dinitro-phenylhydrazone; benzil betanaphthylosazone; 2-nitrochalcone semicarbazone; alpha, gammadiphenyl fulgide; 4,4′-diformamido-2,2′-stilbene disulfonic acid; 3-(p-dimethylaminophenylamino)-camphor; and 2-(2′,4′-dinitrobenzyl) pyridine. These produce essentially the same results as Example I when a 20-minute exposure is employed.

Examples XXVIII–XXXIII

The procedure of Example I is repeated except that the following resins are substituted for the Amberol resin in Examples XXVII–XXXIII, respectively; ethyl hydroxy cellulose; ethyl cellulose; nitrocellulose; polyethylacrylate; polymethylacrylate and polymethylmethacrylate. All produce about the same results as Example I.

Example XXXIV

A spiran-Amberol resin coating is applied to an aluminum plate and air dried according to the procedure of Example I. However, Carboset resin overcoating is applied to this dried film. This imaging member is then exposed to an image to be reproduced according to the procedure of Example I and developed with a 95/5-methanol-water wash. Again, in this case, the methanol attacks the image area which it selectively wets and when allowed to dry an opaque light scattering image results. Phase separation in this case is induced by the presence of low concentrations of water in the methanol.

Example XXXV

An imaging member is coated and exposed according to the procedure of Example XXXIV, except that development is affected by washing the imaging layer with a saturated methanol solution of the Carboset resin of Example I.

Although specific materials and conditions are set forth in the above examples, these are merely illustrative of the present invention. Various other materials, such as any of the typical photochromic and/or resins listed above which are suitable, may be substituted for the materials listed in the examples with similar results. The films of this invention may also have other materials mixed, dispersed, copolymerized or otherwise added thereto to enhance, sensitize, synergize or otherwise modify the properties thereof. In addition the developing liquid may be applied by a number of different techniques such as dipping, roll coating, spraying, etc. Many modifications and/or additions to the process will readily occur to those skilled in the art upon reading this disclosure, and these are intended to be encompassed within the spirit of the invention.

What is claimed is:

1. A photographic method comprising exposing an imaging member comprising an organic photochromic material in an imaging layer to a pattern of actinic electromagnetic radiation of sufficient energy to convert at least a portion of said photochromic material from one photochromic state to another to form a latent image, treating said imaging layer with a developing liquid which selectively wets said imaging layer in conformance to said latent image thereby forming wetted areas conforming to said latent image, said developing liquid containing sufficient solvent to dissolve at least a portion of said imaging layer underlying said wetted areas and a material which forms an incompatible solution with the dissolved portion of said imaging layer upon removal of said solvent, and removing said solvent to form a light scattering image layer comprising said dissolved portion corresponding to said latent image.

2. A photographic method according to claim 1 in which said photochromic material is initially in its lower, unexcited state including exposing said imaging layer with an electromagnetic radiation source of sufficient energy to convert exposed areas thereof to a higher excited photochromic state.

3. A photographic method according to claim 1 in which said photochromic material is initially in its higher excited state including exposing said imaging layer with an electromagnetic radiation source of sufficient energy to convert exposed areas thereof to a lower unexcited photochromic state.

4. A photographic method according to claim 3 including exposing said imaging layer to a pattern to be reproduced with a visible light source capable of causing said photochromic material to return to the lower unexcited state in exposed areas.

5. A method according to claim 1 comprising using a developing liquid which is a solution of a material which is incompatible with said dissolved portion in said imaging layer.

6. A method according to claim 1 in which said developing liquid comprises a mixture of a solvent and a nonsolvent for said imaging layer, said solvent being more volatile than said nonsolvent.

7. A photographic method comprising exposing an imaging member comprising a photochromic 1,3,3-trimethylindolinobenzopyrylospiran material in an imaging layer to a pattern of actinic electromagnetic radiation of sufficient energy to convert at least a portion of said material from one photochromic state to another to form a latent image, treating said imaging layer with a developing liquid which selectively wets said imaging layer in conformance to said latent image thereby forming wetted areas conforming to said latent image, said developing liquid containing sufficient solvent to dissolve at least a portion of said imaging layer underlying said wetted areas and a material which forms an incompatible solution with the dissolved portion of said imaging layer upon removal of said solvent, and removing said solvent to form a light scattering image layer comprising said dissolved portion corresponding to said latent image.

8. A method according to claim 7 in which said material comprises 6′-nitro-1,3,3-trimethylindolinobenzopyrylospiran.

9. A photographic method comprising exposing an imaging layer comprising a solid solution of an insulating resin and an organic photochromic material to a pattern of actinic electromagnetic radiation of sufficient energy to convert at least a portion of said photochromic material from one photochromic state to another to form a latent image, treating said imaging layer with a developing liquid which selectively wets said imaging layer in conformance to said latent image thereby forming wetted areas conforming to said latent image, said developing liquid containing sufficient solvent to dissolve at least a portion of said imaging layer underlying said wetted areas and a material which forms an incompatible solution with the dissolved portions of said imaging layer upon removal of said solvent, and removing said solvent to form a light scattering image layer comprising said dissolved portion corresponding to said latent image.

10. A method according to claim 9 in which said imaging layer comprises from about 1 part by weight of photochromic material to about 8 parts by weight of resin to about 1 part by weight of photochromic material to about ½ part by weight of resin.

11. A method according to claim 9 in which said photochromic material comprises 6′-nitro-1,3,3-trimethylindolinobenzopyrylospiran.

References Cited

UNITED STATES PATENTS

| | | | |
|---|---|---|---|
| 3,116,148 | 12/1963 | Miller | 96—76 XR |
| 3,346,385 | 10/1967 | Foris | 96—36 |

NORMAN G. TORCHIN, *Primary Examiner.*

J. R. EVERETT, *Assistant Examiner.*

U.S. Cl. X.R.

96—90